United States Patent
Yang et al.

(10) Patent No.: US 11,133,462 B2
(45) Date of Patent: Sep. 28, 2021

(54) BOTTOM ELECTRODE STRUCTURE AND METHOD OF FORMING THE SAME

(71) Applicant: International Business Machines Corporation, Armonk, NY (US)

(72) Inventors: Chih-Chao Yang, Glenmont, NY (US); Baozhen Li, South Burlington, VT (US); Andrew Tae Kim, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/436,308

(22) Filed: Jun. 10, 2019

(65) Prior Publication Data

US 2020/0388757 A1 Dec. 10, 2020

(51) Int. Cl.
| | | |
|---|---|---|
| *H01L 27/11507* | (2017.01) | |
| *H01L 27/22* | (2006.01) | |
| *H01L 27/24* | (2006.01) | |
| *H01L 43/02* | (2006.01) | |
| *H01L 45/00* | (2006.01) | |
| *H01L 43/12* | (2006.01) | |

(52) U.S. Cl.
CPC .... *H01L 45/1253* (2013.01); *H01L 27/11507* (2013.01); *H01L 27/222* (2013.01); *H01L 27/2463* (2013.01); *H01L 43/02* (2013.01); *H01L 43/12* (2013.01); *H01L 45/06* (2013.01); *H01L 45/08* (2013.01); *H01L 45/1233* (2013.01); *H01L 45/1246* (2013.01); *H01L 45/1675* (2013.01); *H01L 45/1683* (2013.01)

(58) Field of Classification Search
CPC .............. H01L 45/1253; H01L 27/222; H01L 27/2463; H01L 45/08; H01L 45/1246; H01L 45/06; H01L 45/1683; H01L 45/1233; H01L 45/1675; H01L 43/12; H01L 27/11507; H01L 43/02
See application file for complete search history.

(56) References Cited

U.S. PATENT DOCUMENTS

| | | | |
|---|---|---|---|
| 5,504,041 A | 4/1996 | Summerfelt | |
| 6,001,660 A | 12/1999 | Park et al. | |
| 6,271,131 B1 | 8/2001 | Uhlenbrock et al. | |
| 6,445,023 B1 | 9/2002 | Vaartstra et al. | |
| 7,361,586 B2 * | 4/2008 | Adem ............... | H01L 21/76834 257/E21.582 |
| 7,830,019 B2 | 11/2010 | Chanda et al. | |
| 8,508,018 B2 * | 8/2013 | Akolkar ................ | C25D 5/02 257/508 |

(Continued)

*Primary Examiner* — Edward Chin
(74) *Attorney, Agent, or Firm* — Scully, Scull, Murphy & Presser. P.C.; L. Jeffrey Kelly, Esq.

(57) ABSTRACT

A void-less bottom electrode structure is formed at least partially in a via opening having a small feature size and containing a conductive landing pad structure which is composed of a metal-containing seed layer that is subjected to a reflow anneal. A metal-containing structure is located on a topmost surface of the bottom electrode structure. The metal-containing structure may be composed of an electrically conductive metal-containing material or a material stack of electrically conductive metal-containing materials. In some embodiments, the bottom electrode and the metal-containing structure collectively provide a non-volatile memory device.

10 Claims, 7 Drawing Sheets

(56) References Cited

U.S. PATENT DOCUMENTS

| | | |
|---|---|---|
| 9,960,078 B1 | 5/2018 | Clevenger et al. |
| 10,032,721 B2 | 7/2018 | Adusumilli et al. |
| 2007/0210448 A1 | 9/2007 | Wong et al. |
| 2014/0327139 A1 | 11/2014 | Yu et al. |

\* cited by examiner

BOTTOM ELECTRODE STRUCTURE AND METHOD OF FORMING THE SAME

BACKGROUND

The present application relates to an interconnect structure or a memory structure which includes a reliable and void-less bottom electrode structure formed at least partially in a via opening of a dielectric material layer.

In typical interconnect structure or memory structure processing, a bottom electrode structure is formed into a via opening having a small feature size by utilizing chemical vapor deposition (CVD) or physical vapor deposition (PVD). Due to the small feature size of the via opening, the CVD or PVD bottom electrode structure has an unwanted void which may adversely affect the integrity of the interconnect structure or memory structure. There is a need for providing a method that can provide a void-less bottom electrode structure into a via opening having a small feature size.

SUMMARY

A void-less bottom electrode structure is formed at least partially in a via opening having a small feature size and containing a conductive landing pad structure which is composed of a metal-containing seed layer that is subjected to a reflow anneal. A metal-containing structure is located on a topmost surface of the bottom electrode structure. The metal-containing structure may be composed of an electrically conductive metal-containing material or a material stack of electrically conductive metal-containing materials. In some embodiments, the bottom electrode and the metal-containing structure collectively provide a non-volatile memory device such as, for example, a ferroelectric memory (FE) device, a resistive random access memory (ReRAM) device, a magnetoresistive random access memory (MRAM) device, or a phase change random access memory (PRAM) device.

In one aspect of the present application, a structure (interconnect structure or memory structure) is provided. In one embodiment, the structure includes an interconnect level including at least one electrically conductive structure embedded in an interconnect dielectric material layer. A dielectric material layer having a via opening is located on the interconnect level, wherein the via opening physically exposes a surface of the at least one electrically conductive structure. A bottom electrode structure is present in at least the via opening. In accordance with the present application, a conductive landing pad structure is located beneath and along sidewalls of the bottom electrode structure that is present in the via opening. A metal-containing structure is located directly on at least the bottom electrode structure.

In another aspect of the present application, a method of forming a structure (interconnect structure or memory structure) is provided. In one embodiment, the method includes forming an interconnect level including at least one electrically conductive structure embedded in an interconnect dielectric material layer. Next, a dielectric material layer having a via opening is formed on the interconnect level, wherein the via opening physically exposes a surface of the at least one electrically conductive structure. A conductive landing pad material layer is then formed on the dielectric material layer and within the via opening by depositing a metal-containing seed layer and then subjecting the metal-containing seed layer to a reflow anneal. Next, a bottom electrode material layer is formed on the conductive landing pad material layer. The bottom electrode material layer and the conductive landing pad material layer that are present outside of the via opening are then removed by a planarization process, while maintaining a portion of the bottom electrode material layer and a portion of the conductive landing pad material layer in the via opening. A metal-containing structure is then formed on at least the portion of the bottom electrode material layer that remains in the via opening.

In another embodiment, the method includes forming an interconnect level including at least one electrically conductive structure embedded in an interconnect dielectric material layer. Next, a dielectric material layer having a via opening is formed on the interconnect level, wherein the via opening physically exposes a surface of the at least one electrically conductive structure. A conductive landing pad material layer is then formed on the dielectric material layer and within the via opening by depositing a metal-containing seed layer and then subjecting the metal-containing seed layer to a reflow anneal. Next, a bottom electrode material layer is formed on the conductive landing pad material layer. At least one layer of an electrically conductive metal-containing material is then formed on the bottom electrode material layer, and thereafter, the at least one layer of electrically conductive metal-containing material, the bottom electrode material layer and the conductive landing pad material layer are patterned to provide a patterned structure located inside and outside of the via opening. The patterned structure includes a remaining portion of the at least one layer of electrically conductive metal-containing material, a remaining portion of the bottom electrode material layer and a remaining portion of the conductive landing pad material layer.

DETAILED DESCRIPTION

Figure 1:
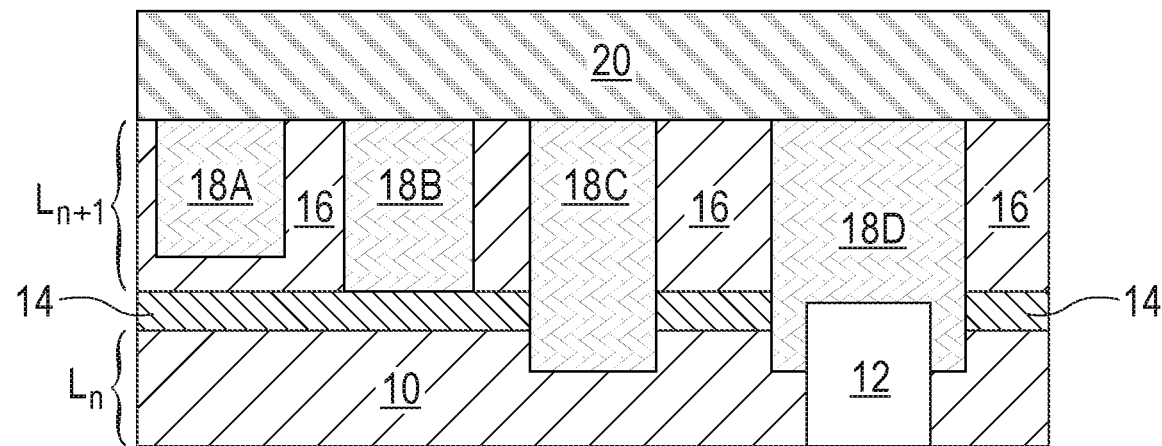
FIG. 1 is a cross sectional view of an exemplary structure that can be employed in accordance with an embodiment of the present application, wherein the exemplary structure includes a lower interconnect level including at least one first electrically conductive structure embedded in a first interconnect dielectric material layer, a dielectric capping layer, an upper second interconnect level including at least one second electrically conductive structure embedded in a second interconnect dielectric material layer and contacting a surface of the at least one first electrically conductive structure, and a dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in accordance with an embodiment of the present application. The exemplary structure includes a lower (or first) interconnect level, $L_n$, including at least one first electrically conductive structure 12 embedded in a first interconnect dielectric material layer 10, a dielectric capping layer 14, an upper (or second) interconnect level, $L_{n+1}$, including at least one second electrically conductive structure 18D embedded in a second interconnect dielectric material layer 16 and contacting a surface of the at least one first electrically conductive structure 12, and a dielectric material layer 20. In accordance with the present application, n is 0 or an integer starting from 1. When n is 0, the lower interconnect level, $L_n$, is omitted and replaced with a front-end-of-the-line structure that includes a semiconductor substrate that contains a plurality of semiconductor devices formed therein or thereupon.

When present, the lower interconnect level, $L_n$, includes a first interconnect dielectric material layer 10 that includes at least one first electrically conductive structure 12 embedded therein. A diffusion barrier liner (not shown) can also be present that surrounds the sidewalls and the bottom wall (i.e., bottommost surface) of the at least one first electrically conductive structure 12 which is embedded in the first interconnect dielectric material layer 10. The first electrically conductive structure 12 is typically an electrically conductive via structure.

The first interconnect dielectric material layer 10 of the lower interconnect level, $L_n$, can be composed of an inorganic dielectric material or an organic dielectric material. In some embodiments, first interconnect dielectric material layer 10 may be porous. In other embodiments, the first interconnect dielectric material layer 10 may be non-porous. Examples of suitable dielectric materials that may be employed as the first interconnect dielectric material layer 10 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 10 may have a dielectric constant (all dielectric constants mentioned herein are measured relative to a vacuum, unless otherwise stated) that is about 4.0 or less. In one embodiment, the first interconnect dielectric material layer 10 has a dielectric constant of 2.8 or less. These dielectrics generally having a lower parasitic cross talk as compared to dielectric materials whose dielectric constant is greater than 4.0.

The first interconnect dielectric material layer 10 may be formed by a deposition process such as, for example, chemical vapor deposition (CVD), plasma enhanced chemical vapor deposition (PECVD) or spin-on coating. The first interconnect dielectric material layer 10 may have a thickness from 50 nm to 250 nm. Other thicknesses that are lesser than 50 nm, and greater than 250 nm can also be employed in the present application.

After providing the first interconnect dielectric material layer 10, at least one opening (not shown) is formed into the first interconnect dielectric material layer 10; each opening will house a first electrically conductive structure 12 and, if present, the diffusion barrier liner. The at least one opening in the first interconnect dielectric material layer 12 is typically a via opening. The at least one opening can be formed by lithography and etching.

In some embodiments, a diffusion barrier material is then formed within the at least one opening and on an exposed topmost surface of the first interconnect dielectric material layer 10; the diffusion barrier material will provide the diffusion barrier liner mentioned above. The diffusion barrier material may include Ta, TaN, Ti, TiN, Ru, RuN, RuTa, RuTaN, W, WN or any other material that can serve as a barrier to prevent a conductive material from diffusing there through. The thickness of the diffusion barrier material may vary depending on the deposition process used as well as the material employed. In some embodiments, the diffusion barrier material may have a thickness from 2 nm to 50 nm; although other thicknesses for the diffusion barrier material are contemplated and can be employed in the present application as long as the diffusion barrier material does not entirely fill the opening. The diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier material. In some embodiments, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

Next, an electrically conductive metal or metal alloy is formed into each opening and, if present, atop the diffusion barrier material. The electrically conductive metal or metal alloy provides the first electrically conductive structure 12 of the present application. The electrically conductive metal or metal alloy can be composed of copper (Cu), aluminum (Al), tungsten (W), or an alloy thereof such as, for example, a Cu—Al alloy. The electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy. In some embodiments, the electrically conductive metal or metal alloy is formed above the topmost surface of the first interconnect dielectric material layer 10.

Following the deposition of the electrically conductive metal or metal alloy, a planarization process such as, for example, chemical mechanical polishing (CMP) and/or grinding, can be used to remove all electrically conductive metal or metal alloy (i.e., overburden material) that is present outside each of the openings forming the first electrically conductive structure 12. The planarization stops on a topmost surface of the first interconnect dielectric material layer 10. Thus, and if present, the planarization process also removes the diffusion barrier material from the topmost surface of the first interconnect dielectric material layer 10. The remaining portion of the diffusion barrier material that is present in the at least one opening is referred to herein as the diffusion barrier liner, while the remaining first electrically conductive metal or metal alloy that is present in the at least one opening may be referred to as the first electrically conductive structure 12. In some embodiments, the planarization process is omitted. Collectively, the first interconnect dielectric material layer 10, each optional diffusion barrier liner, and each first electrically conductive structure 12 define the lower interconnect level, $L_n$, of the present application.

Next, and in some embodiments, a dielectric capping layer 14 can be formed on the physically exposed topmost surface of the lower interconnect level, $L_n$, of the present application. In some embodiments, the dielectric capping layer 14 can be omitted. When present, the dielectric capping layer 14 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric material that provides the dielectric capping layer 14 can be formed utilizing a deposition process such as, for example, CVD, PECVD, ALD, chemical solution deposition or evaporation. When present, the dielectric capping layer 14 typically has a thickness from 10 nm to 100 nm; although other thicknesses that are different from the exemplary thickness range can be used as the thickness of the dielectric capping layer 14.

Next, the second interconnect dielectric material layer 16 is formed above the lower interconnect level, $L_n$. The second interconnect dielectric material layer 16 may include one of the interconnect dielectric materials mentioned above for the first interconnect dielectric material layer 10. In some embodiments, the second interconnect dielectric material layer 16 includes a same interconnect dielectric material as the first interconnect dielectric material layer 10. In other embodiments, the second interconnect dielectric material layer 16 includes a different interconnect dielectric material than the first interconnect dielectric material layer 10. The second interconnect dielectric material layer 16 may be porous or non-porous, have a thickness within the thickness range of the first interconnect dielectric material layer 10, and be formed utilizing one of the deposition processes used in providing the first interconnect dielectric material layer 10.

Next, at least one opening (not shown) having a width that is greater than the width of the first electrically conductive structure 12 can then be formed into the second interconnect dielectric material layer 16. During or, after, the forming of the at least one opening, the dielectric capping layer 14 is opened to physically expose a surface of the first electrically conductive structure 12. Other openings (not shown) can be formed into the second interconnect dielectric material layer 16 which may, or may not extend, into the first interconnect dielectric material layer 10. In embodiments in which n is 0, some of the openings that are formed into the second interconnect dielectric material layer 16 can physically expose a conductive material or conductive region of one of the semiconductor devices that is formed upon or within a semiconductor substrate. The at least one opening is formed by lithography and etching.

The at least one opening that is formed into the second interconnect dielectric material layer 16 is processed to include at least a second electrically conductive structure. In FIG. 1, elements 18A, 18B, 18C and 18D represent such second electrically conductive structures. As is shown, at least one of the second electrically conductive structures, e.g., second electrically conductive structure 18D, has a surface that contacts a surface of the first electrically conductive structure 12, a conductive structure or a conductive region.

The second electrically conductive structures 18A, 18B, 18C and 18D may include one of the electrically conductive metals or metal alloys mentioned above for the first electrically conductive structure 12. In one embodiment, the second electrically conductive structures 18A, 18B, 18C and 18D may include a same electrically conductive metal or metal alloy as the first electrically conductive structure 12. In another embodiment, the second electrically conductive structures 18A, 18B, 18C and 18D may include a compositionally different electrically conductive metal or metal alloy than the first electrically conductive structure 12. The second electrically conductive structures 18A, 18B, 18C and 18D can be formed utilizing the same technique as mentioned above for forming the first electrically conductive structure. A diffusion barrier liner, as defined above, may or may not be formed along the sidewalls and along the bottom wall of each second electrically conductive structure.

Next, dielectric material layer 20 is formed. Dielectric material layer 20 can be composed of any dielectric material including one of the dielectric materials mentioned above for the first interconnect dielectric material layer 10 or the dielectric capping layer 14. The dielectric material layer 20 can be formed by a deposition process such as, for example, CVD, PECVD, ALD, chemical solution deposition or evaporation. The dielectric material layer 20 typically has a thickness from 50 nm to 500 nm; although other thicknesses that are different from the exemplary thickness range can be used as the thickness of the dielectric material layer 20.

Figure 2:
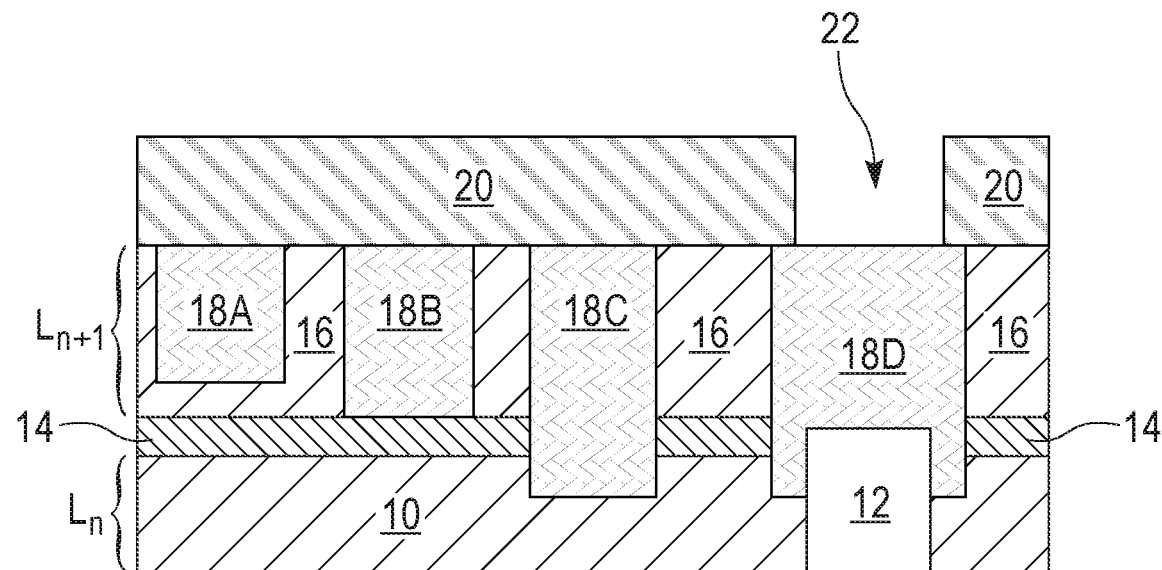
FIG. 2 is a cross sectional view of the exemplary structure of FIG. 1 after forming a via opening within the dielectric material layer which physically exposes one of the second electrically conductive structures embedded in the second interconnect dielectric material layer.

Referring now to FIG. 2, there is illustrated the exemplary structure of FIG. 1 after forming a via opening 22 within the dielectric material layer 20 which physically exposes one of the second electrically conductive structures, i.e., second electrically conductive structure 18D, embedded in the second interconnect dielectric material layer 16. The via opening 22 can be formed by lithography and etching. Lithography includes applying a photoresist material over a material or material stack to be patterned, exposing the photoresist material to a pattern of irradiation, and developing the exposed photoresist material. The etching may include an anisotropic etch etching process such as, for example, reactive ion etching. The via opening 22 has a width that is less than the width of the underlying second electrically conductive structure 18D. In one example, the via opening 22 has a width from 10 nm to 200 nm.

Figure 3:
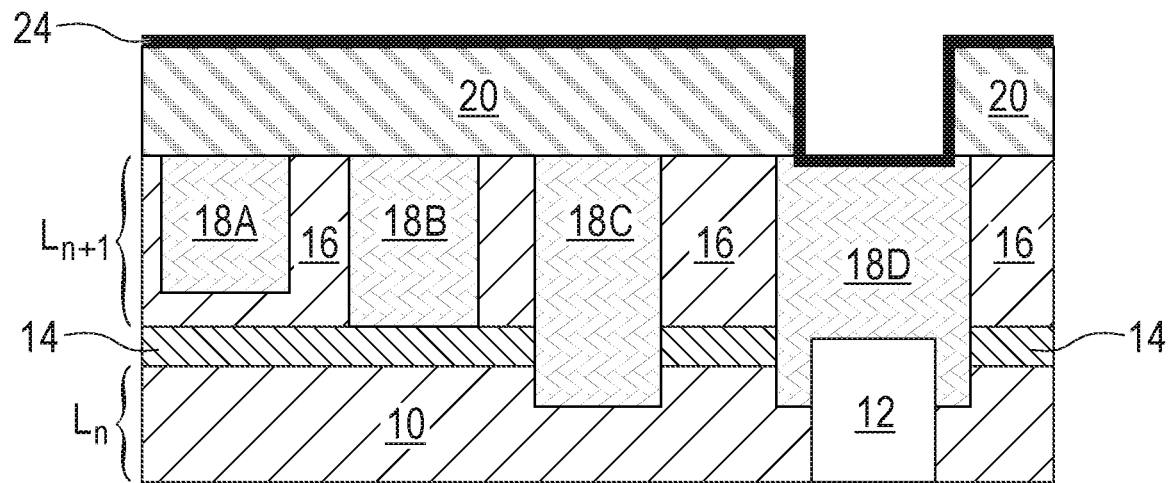
FIG. 3 is a cross sectional view of the exemplary structure of FIG. 2 after forming a diffusion barrier material layer on the dielectric material layer and within the via opening.

Referring now to FIG. 3, there is illustrated the exemplary structure of FIG. 2 after forming a diffusion barrier material layer 24 on the dielectric material layer 20 and within the via opening 22. In some embodiments, the formation of the diffusion barrier material may be omitted. The diffusion barrier material layer 24 is composed of a diffusion barrier material as defined above. Some examples of diffusion barrier materials that can provide the diffusion barrier material layer 24 include, but are not limited to, metal diffusion barriers such as Ta, Ti, Co, Ru, W, Ir, Rh or alloys thereof, or metal nitride diffusion barriers such as TaN, TiN, RuN, RuTaN, or WN.

The thickness of the diffusion barrier material layer 24 may vary depending on the deposition process used as well as the material employed. In some embodiments, the diffusion barrier material layer 24 may have a thickness from 2 nm to 50 nm; although other thicknesses for the diffusion barrier material layer 24 are contemplated and can be employed in the present application as long as the diffusion barrier material layer 24 does not entirely fill the via opening 22. The diffusion barrier material layer 24 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 4:
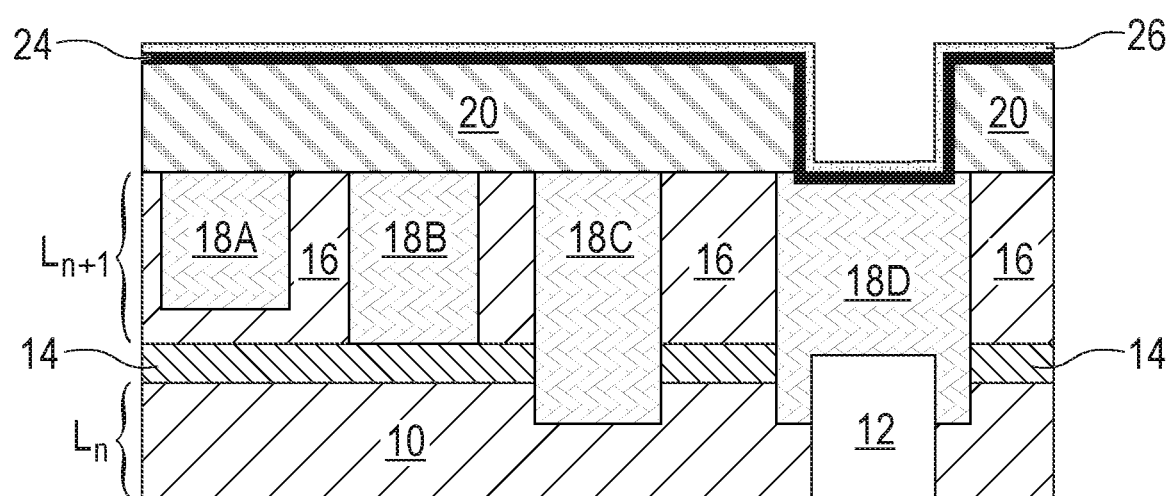
FIG. 4 is a cross sectional view of the exemplary structure of FIG. 3 after forming a metal-containing seed layer on the diffusion barrier material layer.

Referring now to FIG. 4, there is illustrated the exemplary structure of FIG. 3 after forming a metal-containing seed layer 26 on the diffusion barrier material layer 24; when the diffusion barrier material layer is omitted, the metal-containing seed layer 26 is formed on the structure shown in FIG. 2. The metal-containing seed layer 26 that is employed in the present application is composed of a metal-containing material that can be reflowed during a subsequently performed reflow anneal. Examples of metal-containing materials that can be employed in the present application include, but are not limited to, Cu, Al, CuN, AlN or a Cu—Al alloy. The thickness of the metal-containing seed layer 26 may vary depending on the deposition process used as well as the material employed. In some embodiments, the metal-containing seed layer 26 may have a thickness from 2 nm to 500 nm; although other thicknesses for the metal-containing seed layer 26 are contemplated and can be employed in the present application as long as the metal-containing seed layer 26 does not entirely fill the via opening 22. The metal-containing seed layer 26 can be formed by a deposition process including, for example, chemical vapor deposition (CVD), plasma enhanced chemical vapor deposition (PECVD), atomic layer deposition (ALD), physical vapor deposition (PVD), sputtering, or plating. In one embodiment, the metal-containing seed layer 26 is composed of high-purity (greater than 99.999%) Cu that is deposited using electrochemical plating.

Figure 5:
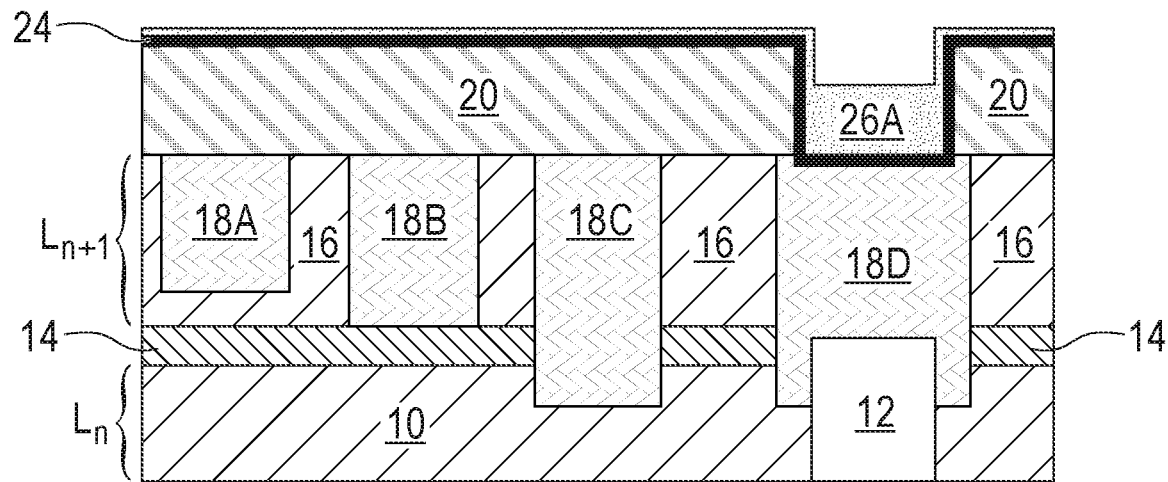
FIG. 5 is a cross sectional view of the exemplary structure of FIG. 4 after performing a reflow anneal in which the metal-containing seed layer is subject to reflow to provide a conductive landing pad material layer.

Referring now to FIG. 5, there is illustrated the exemplary structure of FIG. 4 after performing a reflow anneal in which the metal-containing seed layer 26 is subject to reflow. The reflow anneal may include a furnace anneal or a laser anneal; laser annealing is typically performed for a shorter period of time than furnace anneal. The reflow anneal is performed at a temperature that melts the conductive metal, metal nitride or metal alloy that provides the metal-containing seed layer 26 such that the same flows into and fills the via opening 22. As is known to those skilled in the art, capillary force/surface tension is the driving force pulling the metal-containing seed layer 26 into the via opening 22.

In one example, and when the reflow anneal is performed in a furnace, the 'furnace' reflow anneal can be performed at a temperature from 60° C. to 500° C. for a time period from 10 minutes to 6 hours. In another example, and when the reflow anneal is performed using a laser, the 'laser' reflow anneal is performed at a temperature from 400° C. to 1000° C. for a time period of a few nanoseconds.

The reflowed metal-containing seed layer 26 can be referred to herein as a conductive landing pad material layer 26A. The conductive landing pad material layer 26A has a first region that is located in the via opening 22 that is thicker than a second region of the conductive landing pad material layer 26A that is located predominately outside the via opening 22; a portion of the thinner second region of the conductive landing pad material layer 26A is present along an upper portion of the sidewalls of the via opening 22 as shown in FIG. 5.

Figure 6:
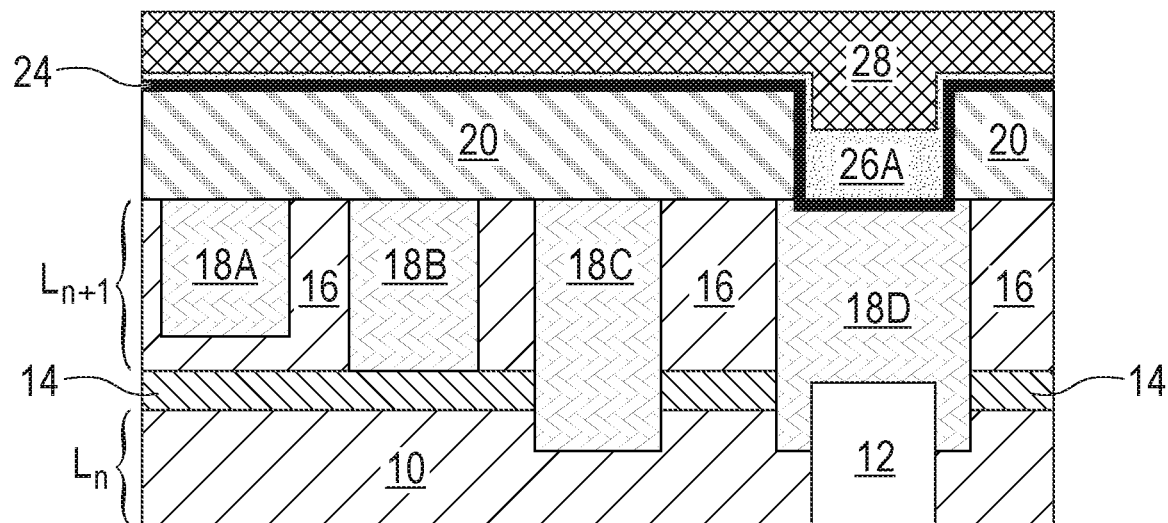
FIG. 6 is a cross sectional view of the exemplary structure of FIG. 5 after forming a bottom electrode material layer on the conductive landing pad material layer.

Referring now to FIG. 6, there is illustrated the exemplary structure of FIG. 5 after forming a bottom electrode material layer 28 on the conductive landing pad material layer 26A. The bottom electrode material layer 28 is composed of an electrically conductive metallic material having a different composition than the metal-containing seed layer 26 that provides the conductive landing pad material layer 26A. The bottom electrode material layer 28 can be composed of an electrically conductive metal, an electrically conductive metal alloy or an electrically conductive metal nitride. The metal that provides the bottom electrode material layer 28 may be Ta, Ti, W, Co, Ru, Ir or Rh.

The bottom electrode material layer 28 may be formed utilizing a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The bottom electrode material layer 28 may have a thickness from 5 nm to 100 nm; although other thicknesses besides the exemplary thickness range can be used as the thickness of the bottom electrode material layer 28.

Figure 7:
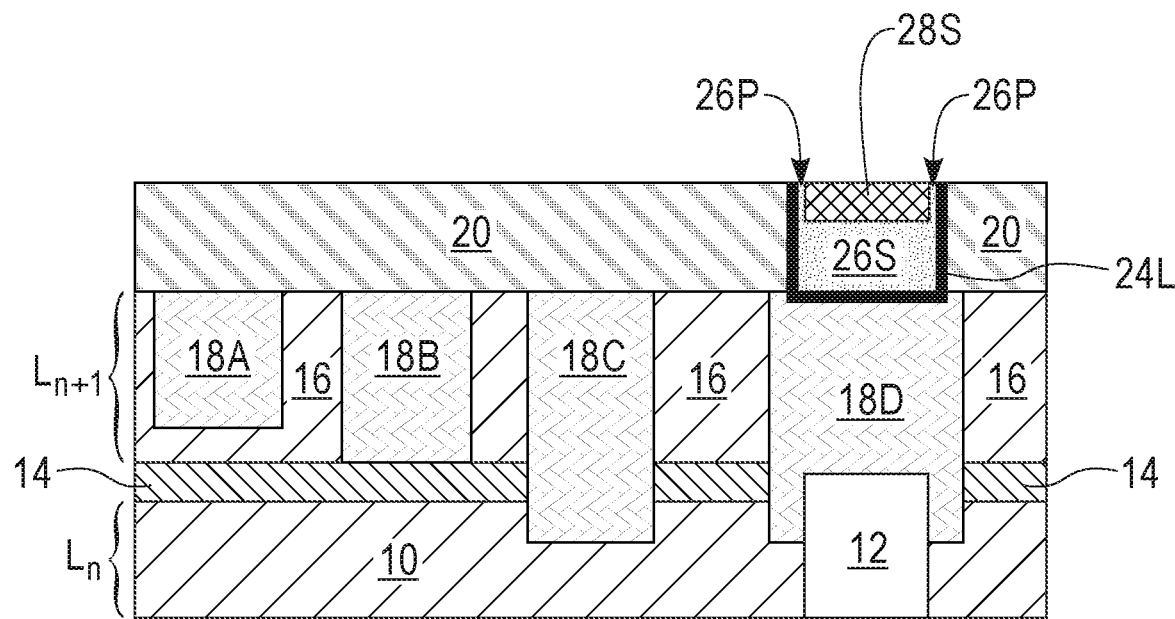
FIG. 7 is a cross sectional view of the exemplary structure of FIG. 6 after performing a planarization process to form a bottom electrode structure in the via opening formed in the dielectric material layer, wherein a conductive landing pad structure composed of a remaining portion of the conductive landing pad material layer is located beneath and along sidewalls of the bottom electrode structure.

Referring now to FIG. 7, there is illustrated the exemplary structure of FIG. 6 after performing a planarization process to form a bottom electrode structure 28S in the via opening 22 formed in the first dielectric material layer 20, wherein a conductive landing pad structure 26S composed of a remaining portion of the conductive landing pad material layer 26A is located beneath and along sidewalls of the bottom electrode structure 28S.

The planarization process, which can include, for example, chemical mechanical polishing (CMP) and/or grinding, removes the bottom electrode material layer 28, the conductive landing pad material layer 26A and, if present, the diffusion barrier material layer 24 that is located outside the via opening 22. Portions of the bottom electrode material layer 28, the conductive landing pad material layer 26A and, if present, the diffusion barrier material layer 24 remain in the via opening 22. The remaining portion of the bottom electrode material layer 28 that is present in the via opening 22 is referred to herein as the bottom electrode structure 28S, the remaining portion of the conductive landing pad material layer 26A that remains in the via opening 22 is referred to herein as the conductive landing pad structure 26S, and, when present, the remaining portion of the diffusion barrier material layer 24 that remains in the via opening 22 is referred to as a diffusion barrier liner 24L.

The conductive landing pad structure 26S has a thin portion 26P that is located on sidewalls of the bottom electrode structure 28S. If present, the diffusion barrier liner 24L is U-shaped. The term "U-shaped" is used throughout the present application to denote that a material has a horizontal portion in which a vertical portion extends upwards from each end of the horizontal portion.

The bottom electrode structure 28S has a topmost surface that is coplanar with a topmost surface of each of the dielectric material layer 20, the thin portions 26P of the conductive landing pad structure 26S, and, if present, the vertical portions of the diffusion barrier layer 24L.

Figure 8:
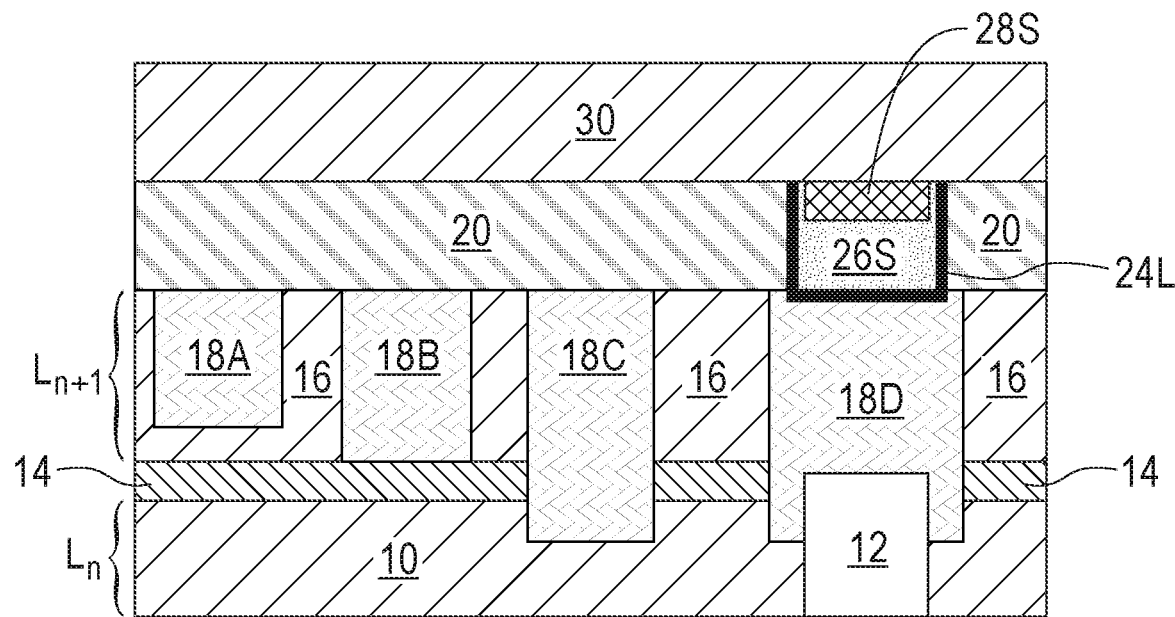
FIG. 8 is a cross sectional view of the exemplary structure of FIG. 7 after forming a third interconnect dielectric material layer.

Referring now to FIG. 8, there is illustrated the exemplary structure of FIG. 7 after forming a third interconnect dielectric material layer 30. The third interconnect dielectric material layer 30 is composed of one of the dielectric materials mentioned above for the first interconnect dielectric material layer 10. In one embodiment, the third interconnect dielectric material layer 30 is composed of a same dielectric material as the first interconnect dielectric material layer 10 and/or the second interconnect dielectric material layer 16. In another embodiment, the third interconnect dielectric material layer 30 is composed of a different dielectric material than the first interconnect dielectric material layer 10 and/or the second interconnect dielectric material layer 16.

The third interconnect dielectric material layer 30 may be formed using one of the deposition techniques mentioned above for forming the first interconnect dielectric material layer 10. The third interconnect dielectric material layer 30 may have a thickness from 50 nm to 900 nm; although other thicknesses besides the exemplary thickness range can be used as the thickness of the third interconnect dielectric material layer 30.

Figure 9:
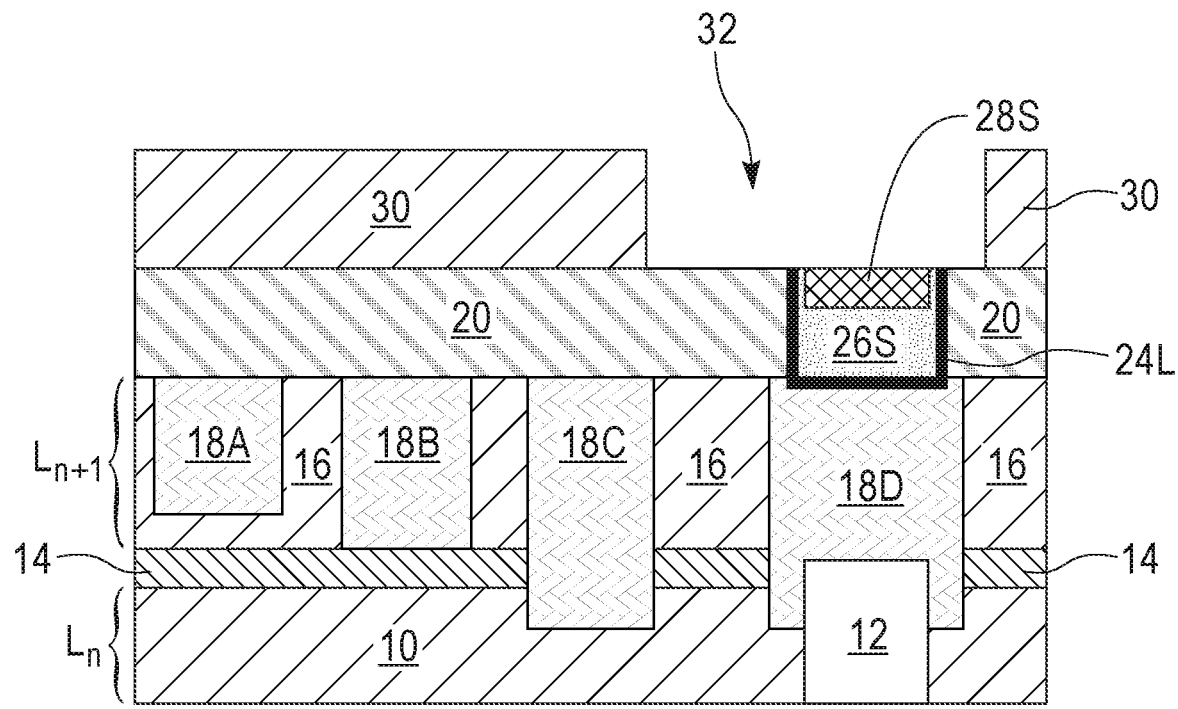
FIG. 9 is a cross sectional view of the exemplary structure of FIG. 8 after forming an opening in the third interconnect dielectric material layer that physically exposes the bottom electrode structure and the conductive landing pad structure.

Referring now to FIG. 9, there is illustrated the exemplary structure of FIG. 8 after forming an opening 32 in the third interconnect dielectric material layer 30 that physically exposes the bottom electrode structure 28S and the conductive landing pad structure 26S. The opening 32 that is formed into the third interconnect dielectric material layer 30 has a width that is generally greater than the width of the via opening 22 provided to the dielectric material layer 20. In one example, the opening 32 that is formed into the third interconnect dielectric material layer 30 has a width from 15 nm to 400 nm. The opening 32 can be formed by lithography and etching as defined above for forming the via opening 22 into the dielectric material layer 20.

Figure 10:
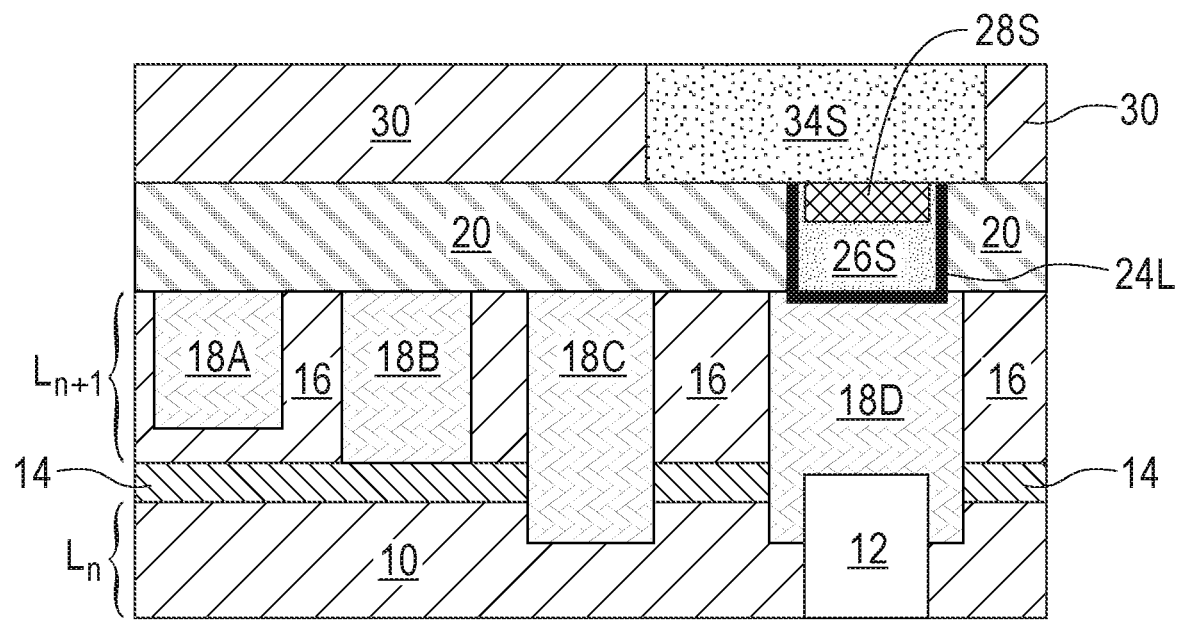
FIG. 10 is a cross sectional view of the exemplary structure of FIG. 9 after forming a metal-containing structure in the opening formed in the third interconnect dielectric material layer.

Referring now to FIG. 10, there is illustrated the exemplary structure of FIG. 9 after forming a metal-containing structure 34S in the opening 32 formed in the third interconnect dielectric material layer 30. The metal-containing structure 34S is composed of at least one layer of an electrically conductive metal-containing material. The metal-containing structure 34S can be formed by depositing a layer of the electrically conductive metal-containing material or a material stack of electrically conductive metal-containing materials and then subjecting the deposited electrically conductive metal-containing material or deposited material stack of electrically conductive metal-containing materials to a planarization process such as, for example, chemical mechanical polishing (CMP) and/or grinding. The metal-containing structure 34S typically has a topmost surface that is coplanar with a topmost surface of the third interconnect dielectric material layer 30, and a bottommost surface that is in direct physical contact with at least the bottom electrode structure 28S.

In one embodiment, the metal-containing structure 34S is composed of one of the electrically conductive metals or metal alloys as mentioned above for the first electrically conductive structure 12. In another embodiment, the metal-containing structure 34S is composed of a stack including one of the electrically conductive metals or metal alloys as mentioned above for the first electrically conductive structure 12. In yet a further embodiment, the metal-containing structure 34S is composed of an electrically conductive metal-containing material stack which, together with the bottom electrode structure 28S, can be used as a non-volatile memory device such as, for example, a ferroelectric memory (FE) device, a resistive random access memory (ReRAM) device, a magnetoresistive random access memory (MRAM) device, or a phase change random access memory (PRAM) device.

A FE memory device is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. Thus, and in the present application, the metal-containing structure 34S is an electrically conductive metal-containing material stack of a ferroelectric layer, and a top electrode; bottom electrode structure 28S serves as the bottom electrode for the FE memory device. The top electrode may be composed of a metal or metal nitride. For example, TiN may be used as the material for the top electrode. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y.

A ReRAM device is a random access memory that typically includes a material stack of, from bottom to top, a bottom electrode, a metal oxide that can exhibit a change in electron localization, and a top electrode. Thus, and in the present application, the metal-containing structure 34S is an electrically conductive metal-containing material stack of a ferroelectric layer, and a top electrode; bottom electrode structure 28S serves as the bottom electrode for the ReRAM device. The top electrode may be composed of a metal or metal nitride. For example, TiN may be used as the material for the top electrode. The metal oxide may include oxides of nickel, zirconium, hafnium, iron, or copper.

A MRAM device is a random access memory, that includes a magnetic tunnel junction (MTJ) structure formed on the bottom electrode structure 28S. The magnetic tunnel junction (MTJ) structure may include a magnetic reference layer, a tunnel barrier, and a magnetic free layer. The magnetic reference layer has a fixed magnetization. The magnetic reference layer may be composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The magnetic free layer of the MTJ structure is composed of at least one magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

A PRAM device is a random access memory that typically includes a material stack of, from bottom to top, a bottom electrode, a phase change memory material that exhibits a change in atomic order (from crystalline to amorphous or vice versa), and a top electrode. Thus, and in the present application, the metal-containing structure 34S is an electrically conductive metal-containing material stack of a ferroelectric layer, and a top electrode; bottom electrode structure 28S serves as the bottom electrode for the PRAM device. The top electrode may be composed of a metal or metal nitride. For example, TiN may be used as the material for the top electrode. The phase change memory material may include a chalcogenide glass such as, for example, $Ge_2Sb_2Te_5$ or $Ge_2Bi_2Te_6$.

Notably, FIG. 10 illustrates an exemplary structure of the present application that includes an interconnect level, $L_{n+1}$, including at least one electrically conductive structure 18D embedded in an interconnect dielectric material layer 16. A dielectric material layer 20 having a via opening 22 is located on the interconnect level, $L_{n+1}$, wherein the via opening 22 physically exposes a surface of the at least one electrically conductive structure 18D. A void-less bottom electrode structure 28S is present in at least the via opening 22, wherein a conductive landing pad structure 26S is located beneath and along sidewalls of the bottom electrode structure 28S that is present in the via opening 22. A metal-containing structure 34S is located directly on the bottom electrode structure 28S; the metal-containing structure 34S may extend onto a surface of the conductive landing pad structure 26S and a surface of the dielectric material layer 20. In this embodiment, the bottom electrode structure 28S has a topmost surface that is coplanar with at least a topmost surface of the conductive landing pad structure 26S as well as dielectric material layer 20.

Figure 11:
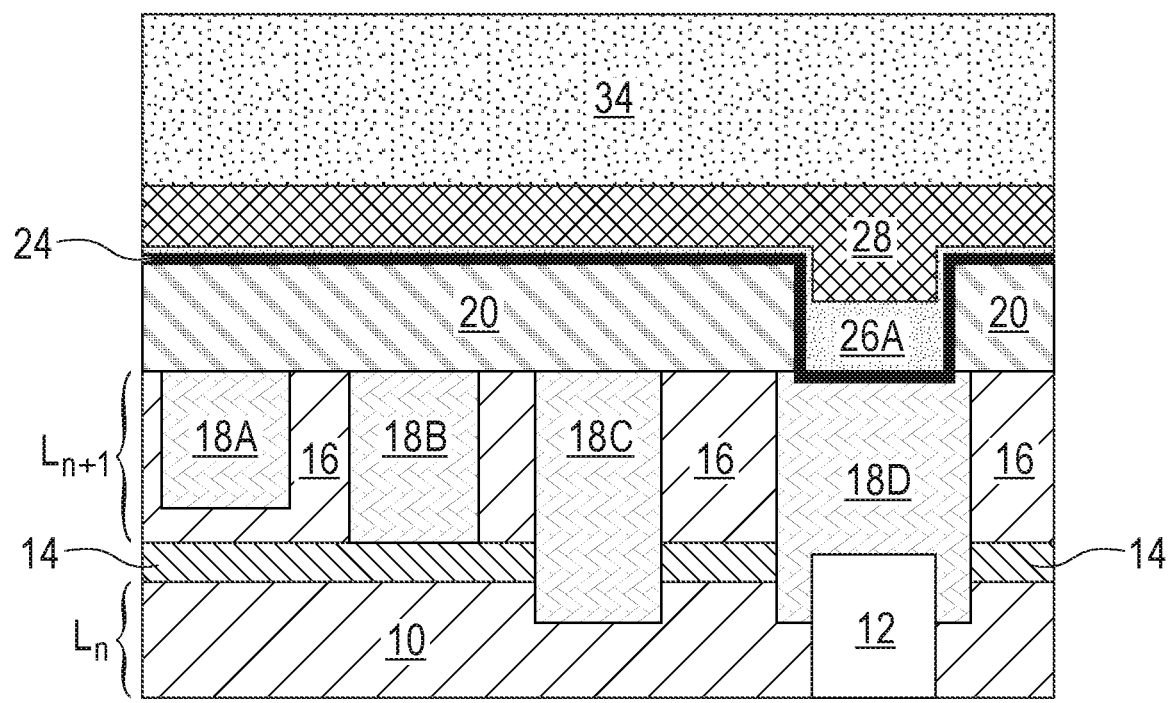
FIG. 11 is a cross sectional view of the exemplary structure of FIG. 6 after forming a metal-containing layer on the bottom electrode material layer.

Referring now to FIG. 11, there is illustrated the exemplary structure of FIG. 6 after forming a metal-containing layer 34 on the bottom electrode material layer 28. The metal-containing layer 34 is composed of an electrically conductive metal-containing material or electrically conductive metal-containing material stack as defined above for the metal-containing structure 34S. The metal-containing layer 34 can be formed by utilizing one or more deposition processes such, as for example, chemical vapor deposition (CVD), plasma enhanced chemical vapor deposition (PECVD), atomic layer deposition (ALD), physical vapor deposition (PVD), sputtering, chemical solution deposition or plating. The metal-containing layer 34 may have a thickness from 5 nm to 500 nm; although other thicknesses besides the exemplary thickness range can be used as the thickness of the metal-containing layer 34.

Figure 12:
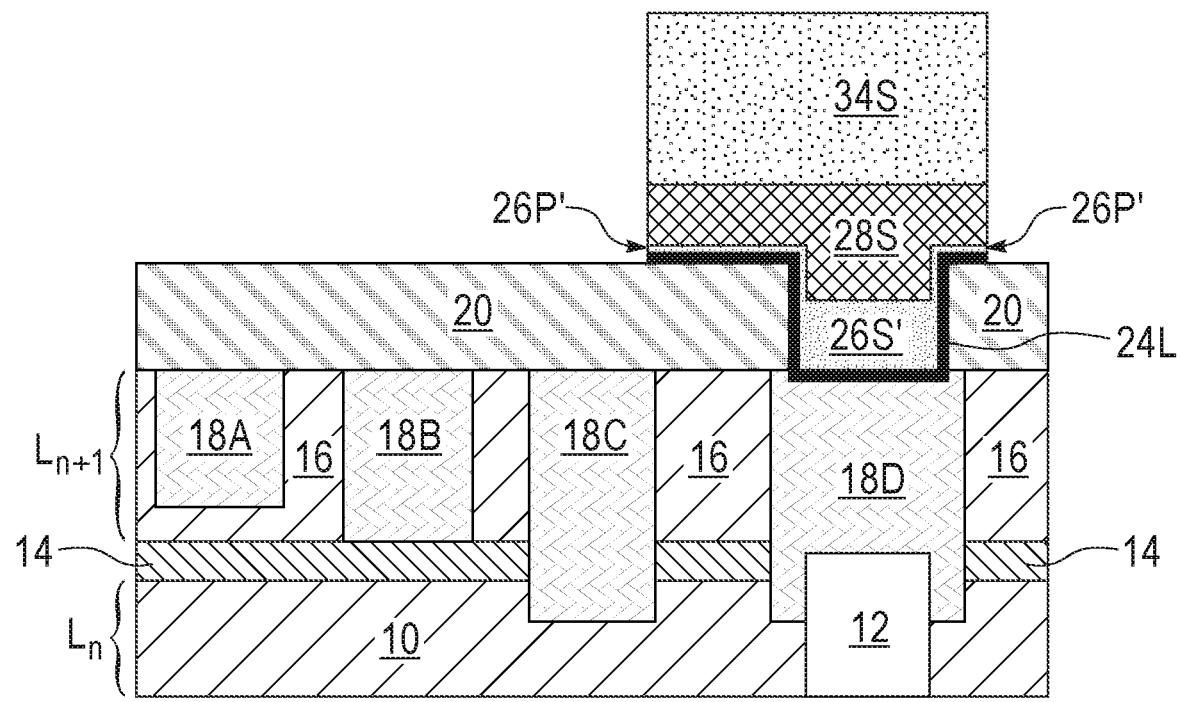
FIG. 12 is a cross sectional view of the exemplary structure of FIG. 11 after patterning the metal-containing layer, the bottom electrode metal layer, the conductive landing pad material layer, and the diffusion barrier material layer to provide a patterned structure.

Referring now to FIG. 12, there is illustrated the exemplary structure of FIG. 11 after patterning the metal-containing layer 34, the bottom electrode metal layer 28, the reflowed metal-containing seed layer (i.e., the conductive landing material layer 26A), and, if present, the diffusion barrier material layer 24 to provide a patterned structure (24L, 26S, 28S, 34S).

In the embodiment illustrated in FIG. 12, the patterned structure includes, from bottom to top, a remaining portion of the diffusion barrier material layer (hereinafter diffusion barrier liner 24L), a remaining portion of the conductive landing pad material layer 26A (hereinafter conductive landing pad structure 26S), a remaining portion of the bottom electrode metal layer 28 (hereinafter bottom electrode structure 28S), and a remaining portion of the metal-containing layer 34 (hereinafter metal-containing structure 34S). The diffusion barrier liner 24L may be omitted from the patterned structure of this embodiment of the present application. Unlike the previous embodiment of the present application in which the diffusion barrier liner 24L (if present), the conductive landing pad structure 26S, and the bottom electrode structure 28S were confined in via opening 22 (see, for example, FIG. 12), the diffusion barrier liner 24L (when present), the conductive landing pad structure 26S, and the bottom electrode structure 28S provided in this example include a portion that is located outside the via opening 22.

The patterning of the metal-containing layer 34, the bottom electrode metal layer 28, the conductive landing pad material layer 26A, and, if present, the diffusion barrier material layer 24 can be performed by lithography and etching.

Figure 13:
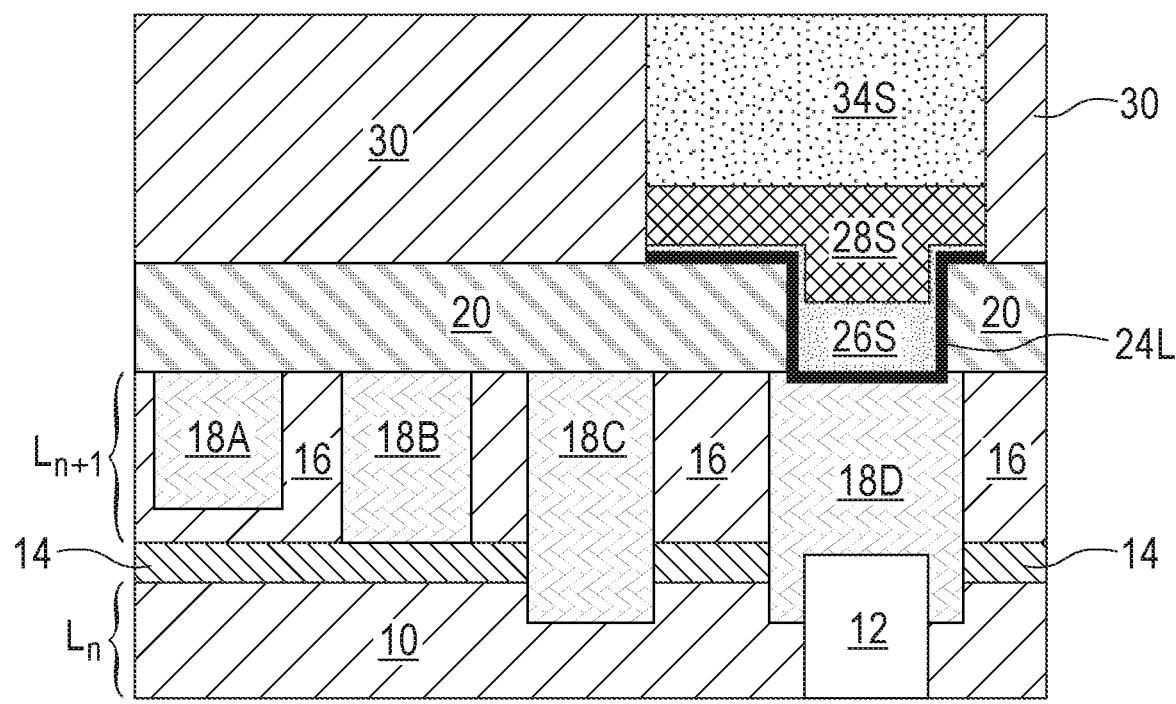
FIG. 13 is a cross sectional view of the exemplary structure of FIG. 12 after forming a third interconnect dielectric material layer laterally adjacent to each sidewall of the patterned structure.

Referring now to FIG. 13, there is illustrated the exemplary structure of FIG. 12 after forming a third interconnect dielectric material layer 30 laterally adjacent to each sidewall of the patterned structure (24L, 26S, 28S, 34S). The third interconnect dielectric material layer 30 is composed of one of the dielectric materials mentioned above for the first interconnect dielectric material layer 10. In one embodiment, the third interconnect dielectric material layer 30 is composed of a same dielectric material as the first interconnect dielectric material layer 10 and/or the second interconnect dielectric material layer 16. In another embodiment, the third interconnect dielectric material layer 30 is composed of a different dielectric material than the first interconnect dielectric material layer 10 and/or the second interconnect dielectric material layer 16.

The third interconnect dielectric material layer 30 may be formed using one of the deposition techniques mentioned above for forming the first interconnect dielectric material layer. Following the deposition of the third interconnect dielectric material layer 30, a planarization process such as, for example, chemical mechanical polishing (CMP) and/or grinding) can be used to provide the exemplary structure shown in FIG. 13. After planarization, the third interconnect dielectric material layer 30 has a topmost surface that is coplanar with a topmost surface of the metal-containing structure 34S of the patterned structure (24L, 26S, 28S, 34S).

Notably, FIG. 13 illustrates an exemplary structure of the present application that includes an interconnect level, $L_{n+1}$, including at least one electrically conductive structure 18D embedded in an interconnect dielectric material layer 16. A dielectric material layer 20 having a via opening 22 is located on the interconnect level, $L_{n+1}$, wherein the via opening 22 physically exposes a surface of the at least one electrically conductive structure 18D. A void-less bottom electrode structure 28S is present in at least the via opening 22, wherein a conductive landing pad structure 26S is located beneath and along sidewalls of the bottom electrode structure 28S that is present in the via opening 22. A metal-containing structure 34S is located directly on the bottom electrode structure 28S. In this embodiment, the bottom electrode structure 28S and the conductive landing pad structure 26S extend outside the via opening 22 and are present atop the dielectric material layer 20.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
    an interconnect level including at least one electrically conductive structure embedded in an interconnect dielectric material layer;
    a dielectric material layer having a via opening located on the interconnect level, wherein the via opening physically exposes a surface of the at least one electrically conductive structure;
    a bottom electrode structure present in at least the via opening;
    a conductive landing pad structure located beneath and along sidewalls of the bottom electrode structure that is present in the via opening, wherein the conductive landing pad structure along the sidewalls of the bottom electrode structure has a lateral thickness, as measured from an innermost sidewall to an outermost sidewall of the conductive landing pad structure, that is less than a vertical thickness of the conductive landing pad structure, as measured from a bottommost surface of the conductive landing pad structure to a bottommost surface of the bottom electrode structure, and wherein the bottom electrode structure has a topmost surface that is coplanar with a topmost surface of the conductive landing pad structure and a topmost surface of the dielectric material layer; and
    a metal-containing structure located directly on at least the bottom electrode structure, wherein a portion of the metal-containing structure extends onto, and directly contacts, the topmost surface of both of the conductive landing pad structure and the dielectric material layer.

2. The structure of claim 1, wherein the bottom electrode structure and the metal-containing structure collectively provide a non-volatile memory device.

3. The structure of claim 2, wherein the non-volatile memory device comprises a ferroelectric memory (FE) device, a resistive random access memory (ReRAM) device, a magnetoresistive random access memory (MRAM) device, or a phase change random access memory (PRAM) device.

4. The structure of claim 1, further comprising a diffusion barrier liner located in the via opening, wherein the diffusion barrier liner is located along sidewalls and a bottom wall of the conductive landing pad structure.

5. The structure of claim 1, wherein the metal-containing structure is embedded in another interconnect dielectric material layer that is located on the dielectric material layer.

6. The structure of claim 1, wherein the bottom electrode structure is composed of an electrically conductive metal, an electrically conductive metal alloy or an electrically conductive metal nitride, wherein the metal is one of Ta, Ti, W, Co, Ru, Ir or Rh.

7. The structure of claim 6, wherein the conductive landing pad structure is compositionally different from the bottom electrode structure and is composed of Cu, Al, CuN, AlN or a Cu—Al alloy.

8. The structure of claim 1, further comprising another interconnect level located beneath the interconnect level, wherein the another interconnect level comprises at least one other electrically conductive structure embedded in another interconnect dielectric material layer, wherein the at least one other electrically conductive structure contacts a surface of the at least one electrically conductive structure embedded in the interconnect dielectric material layer.

9. The structure of claim 8, further comprising a dielectric capping layer separating the another interconnect level from the overlying interconnect level.

10. A structure comprising:
- an interconnect level including at least one electrically conductive structure embedded in an interconnect dielectric material layer;
- a dielectric material layer having a via opening located on the interconnect level, wherein the via opening physically exposes a surface of the at least one electrically conductive structure;
- a bottom electrode structure present in at least the via opening;
- a conductive landing pad structure located beneath and along sidewalls of the bottom electrode structure that is present in the via opening, wherein the conductive landing pad structure along the sidewalls of the bottom electrode structure has a lateral thickness, as measured from an innermost sidewall to an outermost sidewall of the conductive landing pad structure, that is less than a vertical thickness of the conductive landing pad structure, as measured from a bottommost surface of the conductive landing pad structure to a bottommost surface of the bottom electrode structure;
- a metal-containing structure located directly on at least the bottom electrode structure, wherein a portion of both the bottom electrode structure and the conductive landing pad structure extends outside of the via opening and is present above a topmost surface of the dielectric material layer and wherein an outermost sidewall edge of the portion of the bottom electrode structure that is located outside the via opening is vertically aligned to an outermost sidewall edge of the portion of the conductive landing pad structure that is located outside the via opening and an outermost sidewall edge of the metal-containing structure; and
- another dielectric material layer located on and entirely above the dielectric material layer containing the via opening, wherein the metal-containing structure and the portions of the bottom electrode structure and the conductive landing pad structure that extend outside of the via opening are embedded in the another interconnect dielectric material layer and wherein the outermost sidewalls of each of the bottom electrode structure, the conductive landing pad structure and the metal containing structure contact a surface of the another dielectric material layer.

\* \* \* \* \*